United States Patent
Battaglin et al.

(10) Patent No.: US 7,061,157 B2
(45) Date of Patent: *Jun. 13, 2006

(54) ELECTRONIC CIRCUIT FOR HIGHLY EFFICIENT DRIVING OF PIEZOELECTRIC LOADS

(75) Inventors: Luca Battaglin, Castiglione Olona (IT); Pietro Gallina, Carbonate (IT); Giancarlo Saba, Agrate Brianza (IT); Giancarlo Zinco, Broni (IT); Claudio Diazzi, Sesto Calende (IT); Vittorio Peduto, Ivrea (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 10/150,521

(22) Filed: May 17, 2002

(65) Prior Publication Data

US 2003/0062802 A1    Apr. 3, 2003

Related U.S. Application Data

(63) Continuation of application No. PCT/EP01/10788, filed on Sep. 18, 2001.

(30) Foreign Application Priority Data

Sep. 19, 2000   (IT)   .................. MI2000A2043

(51) Int. Cl.
*H01L 41/08*    (2006.01)

(52) U.S. Cl. .................. 310/317; 310/316.01
(58) Field of Classification Search .............
310/316.01–316.03, 317, 319, 318; H01L 41/08
See application file for complete search history.

(56) References Cited

U.S. PATENT DOCUMENTS

| | | | | |
|---|---|---|---|---|
| 4,255,782 A | * | 3/1981 | Joyce | .......................... 363/8 |
| 4,743,789 A | * | 5/1988 | Puskas | ................. 310/316.01 |
| 4,767,959 A | * | 8/1988 | Sakakibara et al. | ......... 310/317 |
| 5,479,062 A | * | 12/1995 | Yoshino | ................ 310/316.03 |
| 6,016,052 A | * | 1/2000 | Vaughn | ...................... 323/355 |
| 6,617,757 B1 | * | 9/2003 | Vazquez Carazo et al. | . 310/317 |
| 6,828,712 B1 | * | 12/2004 | Battaglin et al. | ........... 310/317 |
| 6,853,114 B1 | * | 2/2005 | Bachmaier et al. | .... 310/316.03 |
| 6,876,126 B1 | * | 4/2005 | Okada | ........................ 310/317 |

* cited by examiner

*Primary Examiner*—Mark Budd
(74) *Attorney, Agent, or Firm*—Lisa K. Jorgenson; Bryan A. Santarelli; Graybeal Jackson Haley LLP

(57) ABSTRACT

The invention relates to a circuit for highly efficient driving of piezoelectric loads, comprising a linear driving circuit portion connected to the load through an inductive-resistive connection whereto a voltage waveform is applied. Advantageously, the circuit comprises further respective circuit portions, structurally independent, connected in turn to the inductive-resistive connection through respective inductors to supply a considerable fraction of the overall current required by the load in the transient and steady state respectively.

29 Claims, 6 Drawing Sheets

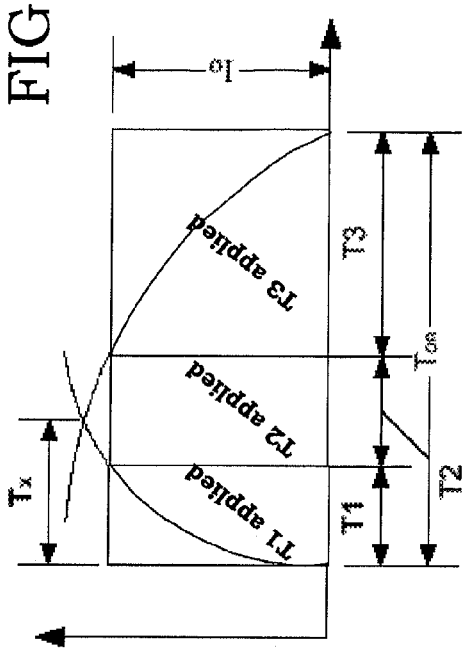
FIG. 9
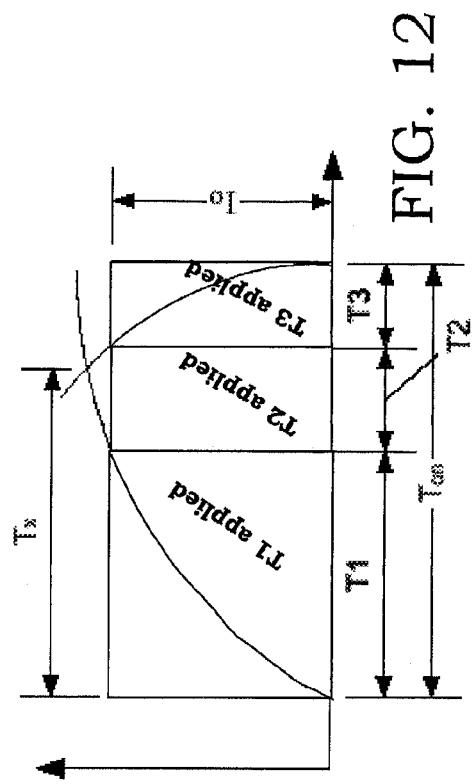
FIG. 10
FIG. 11
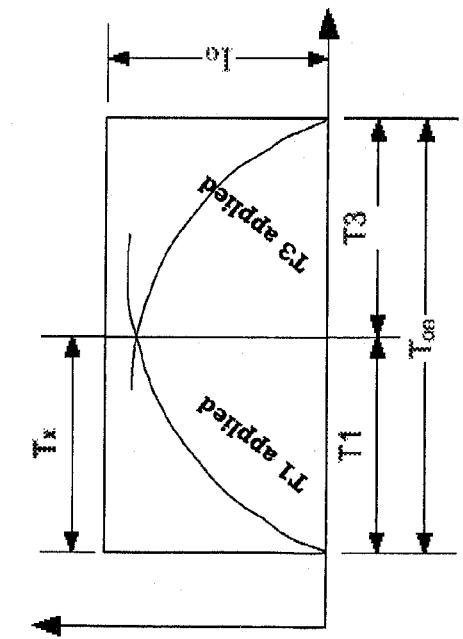
FIG. 12

_US 7,061,157 B2_

ELECTRONIC CIRCUIT FOR HIGHLY EFFICIENT DRIVING OF PIEZOELECTRIC LOADS

CROSS-REFERENCE TO RELATED APPLICATIONS

This is a continuation application which claims priority from PCT/EP01/10788, published in English, filed Sep. 18, 2001; this application also claims priority from Italian Application No. MI2000A002043, filed Sep. 19, 2000. Both applications are herein incorporated by reference

TECHNICAL FIELD

The present invention relates to an electronic circuit for highly efficient driving of piezoelectric loads, comprising a driver circuit portion connected to at least one load terminal by means of an inductive-resistive connection whereon a voltage waveform is applied. The invention relates also to a method for driving a piezoelectric load with inductive-resistive connection. The invention relates particularly, but not exclusively, to a driver circuit adapted to follow the current profile required by a piezoelectric printer head connected to the driver circuit by means of an inductive and resistive cable referred to as flat cable and similar to a resistance and to a series inductor.

BACKGROUND OF THE INVENTION

As is well known in this specific technical field, a wide range of transducers are available such as, for example, those described in the U.S. Pat. No. 5,895,998. Various types of printer heads are among the wide variety of disclosed transducers. In a piezoelectric load such as a printer head, the electronic circuit is driven by applying voltage waveforms generally formed by a series of ramps having a predetermined slew-rate. An example of such an application is disclosed in the U.S. Pat. No. 4,767,959 in the name of Nippondenso Co.

The special accuracy required for applying said voltage waveform to the load terminals, along with the high frequency of the driver signal, leads to the use of linear-mode driver circuits involving high power dissipation. Moreover, the presence of a parasitic inductance in the flat connection cable to the load, which is connected in series to the real capacitive load, requires the current demanded by the load to be filtered. The profile of this current is not rectangular and has a beveled pattern with over- and under-elongations, to produce a voltage waveform as shown in the attached FIG. 1. Therefore, with respect to an ideal case of a merely capacitive load, it is necessary to manage adequately a current slew-rate at the ramp base and a current queue at the ramp end of the capacitive load.

The features of these front end electronic circuits depend on the parasite parameters inserted by the flat cable. The structure conventionally used to apply a voltage waveform to a piezoelectric load with an inductive-resistive connection is also shown in FIG. 1 which illustrates a linear driving example. In practice, the driver circuit of FIG. 1 comprises an operational amplifier having a power output stage sufficient for load driving. The piezoelectric load is typically a non-dissipating capacitive load wherein all electric power is dissipated at the transistors incorporated in the linear driving stage. The linear driving solution is not particularly effective because of the considerable electric power dissipation.

The technical problem underlying the present invention is to provide a driver circuit, particularly for piezoelectric loads, with such functional and structural features to allow a highly efficient load driving without reducing the quality of the waveform generated at the load terminals.

BRIEF SUMMARY OF THE INVENTION

An embodiment of the present invention is directed to a system and method for providing a driver circuit coupled with further driver portions if compared to the linear portions of the prior art, each further portion having to supply as much current as possible during both the transient and the steady condition. The linear driving stage is charged to supply a residual current portion required for following precisely the reference signal. In this manner it is possible to supply the highest amount of current required by the load avoiding in the meantime too frequent switching, which would be required in case of switching-mode driving.

The disclosed embodiments of the invention relate also to a method for driving a piezoelectric load with inductive-resistive connection and wherein at least a linear driving of said load is provided by means of a driver circuit equipped with a linear circuit portion connected to the load by means of said connection. The method is characterized in that it provides two different driving modes, in the transient and in the steady state, wherein the respective circuit portions supply a considerable portion of the overall current required by the load.

The characteristics and advantages of the circuit and method according to the invention will be apparent from the following description of an embodiment thereof given by way of non-limiting example with reference to the attached drawings.

BRIEF DESCRIPTION OF DRAWINGS

FIGS. 9, 10, 11 and 12 are respective current vs. time diagrams indicating some time periods of activation of the circuit of the invention according to an embodiment of the driving method of the invention;

DETAILED DESCRIPTION OF THE PREFERRED EMBODIMENT

Figure 1:
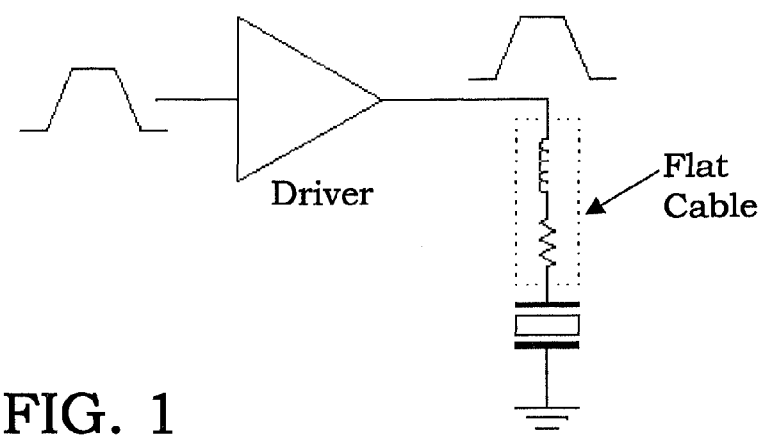
FIG. 1 is a schematic view of a piezoelectric load driver circuit according to the prior art.
Figure 2:
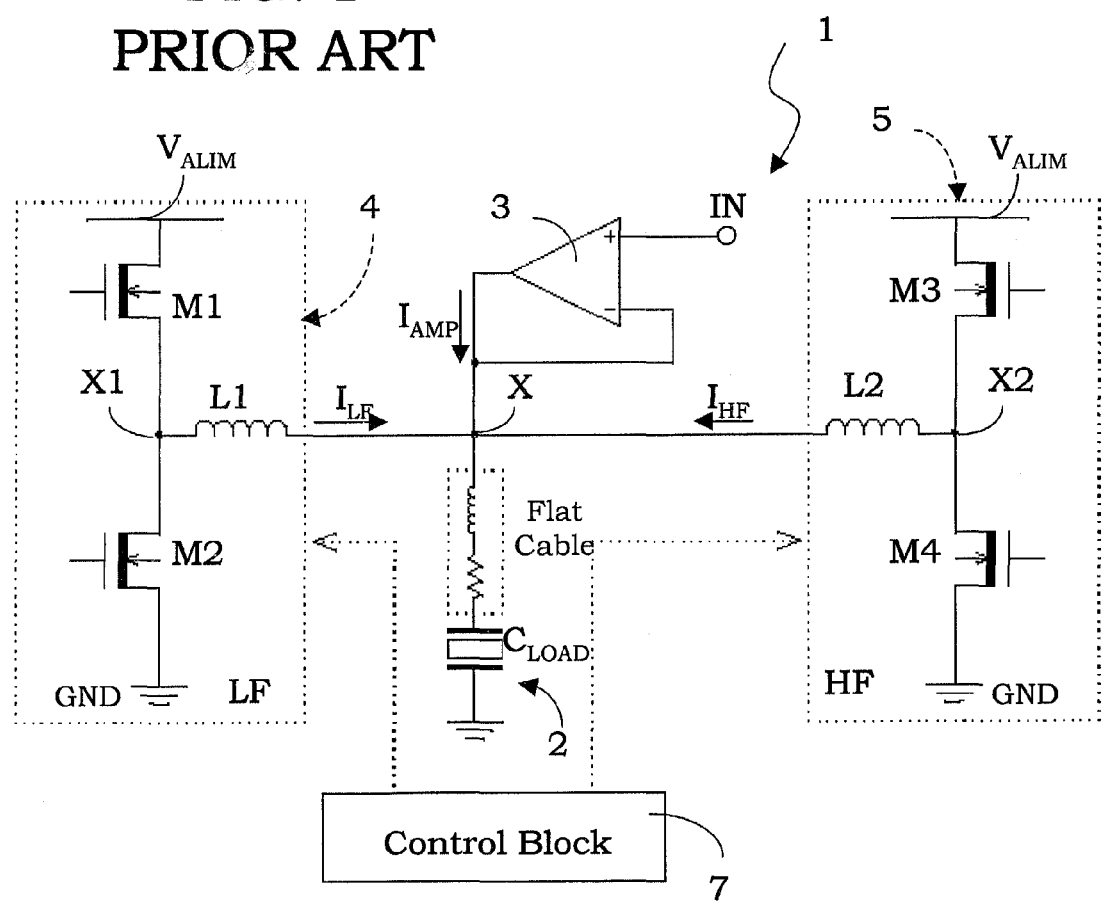
FIG. 2 is a schematic view of a piezoelectric load driver circuit according to an embodiment of the invention.

With reference to the drawings, and particularly to the example of FIG. 2, a driver circuit according to an embodiment of the present invention for driving a piezoelectric load 2 is generally and schematically indicated with circuit 1.

The circuit 1, comprises an operational amplifier 3 having the output in feedback to its inverting input (−) and further connected to one terminal of the load 2, in a node X, to supply a current IAMP. The other non-inverting (+) input of the amplifier 3 receives a reference signal from an input terminal IN of the circuit 1. This amplifier 3 can be considered as the core of the linear portion of the circuit 1. The circuit 1 comprises at least a half-bridge circuit portion, including at least a switching device, connected to the node X through an inductance. More particularly, the circuit 1 further comprises respective half-bridge circuit portions 4, 5, each portion being connected to the node X through a corresponding inductor L1, L2. The portions 4, 5 are structurally independent one from the other. The inductors L1 and L2 have preferably different value, although it is possible to use inductors having the same value. The half-bridge circuit portion 4, indicated with LF, is associated to the inductor L1 with higher value. Likewise, the half-bridge circuit portion 5, indicated with HF, is associated to the inductor L2 with lower value. A control block 7 is provided to drive the half-bridge circuit portions 4 and 5.

The embodiment of FIG. 2 is aimed at supplying the highest amount of current required by the load 2 by means of the two half-bridges 4 and 5, while also avoiding frequent switching. The linear portion 3 therefore supplies the current difference $I_{AMP}$ that is required to follow precisely the voltage reference signal, formed, for instance, by a series of predetermined slew-rate ramps. Thus, the half-bridge circuit portions 4 and 5 supply with high efficiency, in the transient and in the steady state respectively, a considerable portion of the overall current required by the load 2, during which the linear circuit portion 3 ensures the accuracy of the voltage waveform by supplying only the current difference $I_{AMP}$, with considerable power saving.

As just mentioned, in order to meet the load 2 current demands, the half-bridge portion LF utilizes a switching device. More particularly, the switching device comprises a pair of transistors M1, M2 are interconnected together in a node XI. The half-bridge LF is powered between a first supply voltage reference $V_{ALIM}$ and a second ground reference GND. The inductor L1 is inserted between the nodes XI and X. In one embodiment, the half-bridge LF comprises MOS power transistors; however, it is also possible to use a bipolar transistor bridge or half-bridge.

The control terminals of the half-bridge LF transistors M1 and M2 are connected to the control block 7. The control block 7 acts on the transistors M1 and M2 to obtain a current profile as close as possible to the required profile. For this reason, the control block 7 requires information about the duration, the ramp slew-rate and the load $C_{LOAD}$ value.

In a similar and symmetrical manner, the half-bridge HF comprises a pair of transistors M3, M4 interconnected together at a node X2. The half-bridge HF is powered, in turn, between the first supply voltage reference $V_{ALIM}$ and the second ground reference GND. The inductor L2 is inserted between the nodes X2 and X. The control terminals of the half-bridge HF transistors M3 and M4 are all connected to a respective output of the control block 7.

The use of two half-bridges 4 and 5 allows, by an appropriate strategy for closing the transistor switches incorporated therein, an approximation of the profile of the signal in voltage applied to the load. The lower value inductor L2 is suitably sized as to be able to follow the initial transient and the current final queue. The half-bridge 4 with higher value inductor L1 follows the waveform supplying the steady state current value without the need for too frequent switching, which might be required if the half-bridge 5 were used during this phase.

The control strategy is important since it determines the efficiency which can be obtained in terms of power dissipation, as well as the switching frequency of half-bridge switches. The control method for the circuit 1 is based on the measurement of the current $I_{AMP}$ outputted by the operational amplifier 3 and is implemented by dividing the piezoelectric load charge period into three phases. These three method phases are described with reference to the schematic FIGS. 3, 4 and 5.

Figure 3:
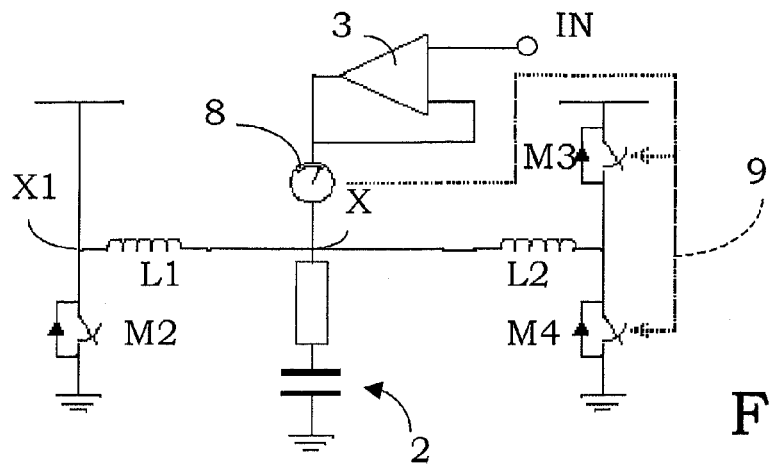
FIGS. 3, 4 and 5 are respective schematic views of the circuit of FIG. 2 in three different operating phases.
Figure 4:
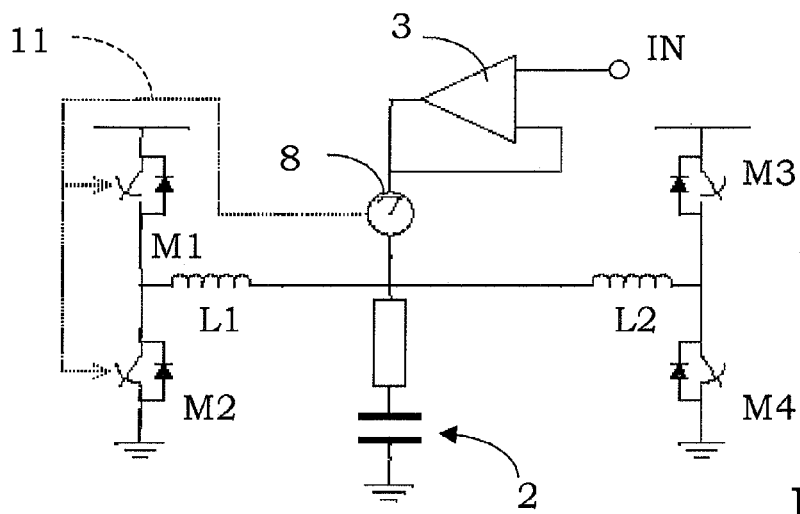
Figure 5:
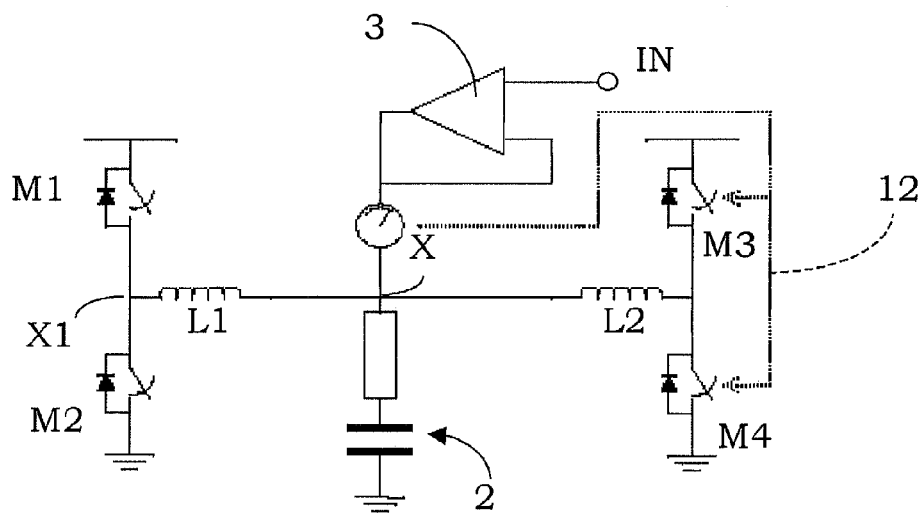

The diagram of the circuit 1 shown in FIGS. 3, 4 and 5 has been modified to show the current $I_{AMP}$ outputted by the linear portion 3 as variable. A sensor 8 is located downstream of the portion 3, upstream of the node X and connected to the control block 7 to detect the current $I_{AMP}$ value. The control block 7 comprises a logic interface coupled with the current sensor 8 and a digital-technology logic network having analog output stages connected to the control terminals of the half-bridge 4 and 5 transistors. Depending on the value of the current $I_{AMP}$, the half-bridge devices are switched according to appropriate control strategies described hereinafter. Steady state transient, T1: During this phase, the switch M1 of the half-bridge LF is closed for the time needed by the current on the inductor L1 to reach the value Io required in the steady condition by the load 2. In this phase, the switch M3 of the half-bridge HF is conveniently switched so that the current injected by the system on the load approximates at best that demand, with the aim, once again, of minimizing the amount of current supplied by the linear portion 3. The control flow is represented by the dot-line 9.

Steady state, T2: Once the current value on the inductor L1 has reached the steady state value Io, the half-bridge HF is deactivated, i.e. the switch M3 is open. At the same time, the half-bridge LF, through the switch M1 control, keeps the output current close to the current required. The control flow is represented by the dot-line 11.

Fall phase, T3: during this phase, it is necessary to shut the half-bridge LF off so that the inductor LI is not charged at a current value other than zero when the current is no longer required by the load 2. This current would otherwise be absorbed by the linear stage in a dissipating manner. During this phase, the half-bridge HF is activated and follows the fast-changing signals having faster charge and discharge transistors. The control flow is represented by the dot-line 12.

The circuit substantially splits the current necessary to be generated for the load 2 into three distinct parts:

(1) two current peaks supplied by the half-bridge HF in correspondence with the fronts $I_{LOAD}$; (2) most of the current in the central portion, in the steady state, supplied by the half-bridge LF; and (3) a corrective current supplied by the linear portion 3.

Figure 6:
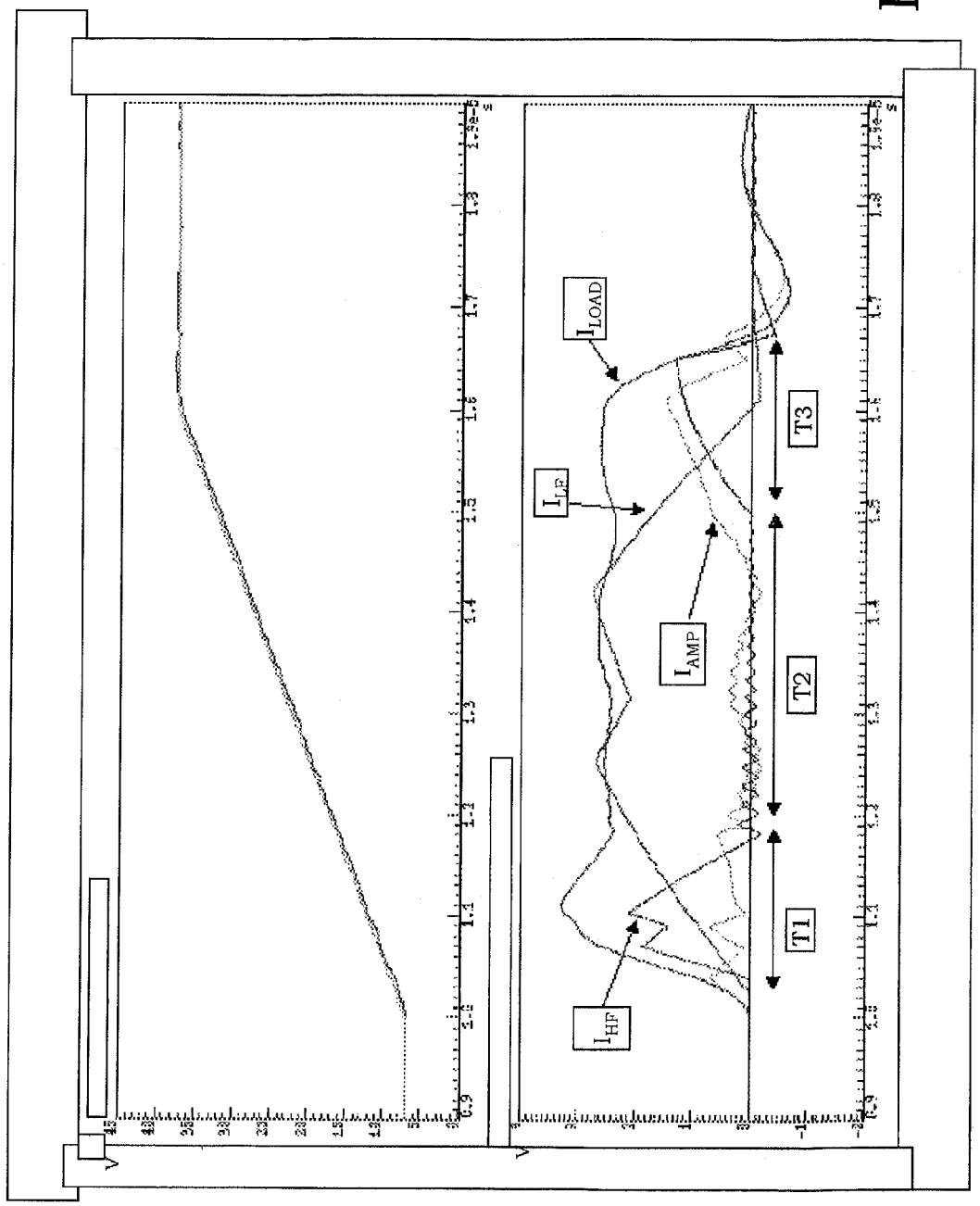
FIG. 6 is a diagram comparing the waveform of the current absorbed by the load with the voltage applied at the load terminals.

FIG. 6 shows graphical plots of the currents injected by the two half-bridges, $I_{LF}$ for the bridge LF and $I_{HF}$ for the bridge HF, of the current $I_{AMP}$ supplied by the operational and of $I_{LOAD}$ required by the load 2. For implementing the control method according to an embodiment of the invention, two procedures are used: a feedback and a feed-forward procedure.

The times T1 and T3 are derived analytically. In feed-forward mode, once the inductor L1 value, the voltage supply $V_{ALIM}$, the load value $C_{LOAD}$, the slew-rate and the initial and final ramp voltages are known, the times T1 and T3 can be ascertained The feedback variable used in the diagram is represented, on the contrary, by the current $I_{AMP}$ outputted by the linear stage. Depending on this current $I_{AMP}$ value, the stage LF is switched during the phase T2 and the stage HF during the phases T1 and T3, according to the criteria described hereinafter.

The feedback variable $I_{AMP}$ may be controlled in several ways. For example, the transistor M1 can be opened at predetermined times and closed again when the current $I_{AMP}$ exceeds a predetermined threshold. A different control scheme provides the use of a hysteresis loop. In this control scheme for example, when the current outputted by the linear portion 3 exceeds an appropriate threshold $I_{HIGH}$, the switch M1 or M3 of the half-bridge LF or HF connected to the supply is closed and, consequently, the current outputted by the non-linear portion increases, whereas the current $I_{AMP}$ of the linear portion decreases until the latter reaches a lower threshold $I_{LOW}$ at which the switch M1 or M3 is opened, thus repeating the cycle. In this way the hysteresis type of control is:

$$I_{HYST} = I_{HIGH} - I_{LOW}$$

Figure 7:
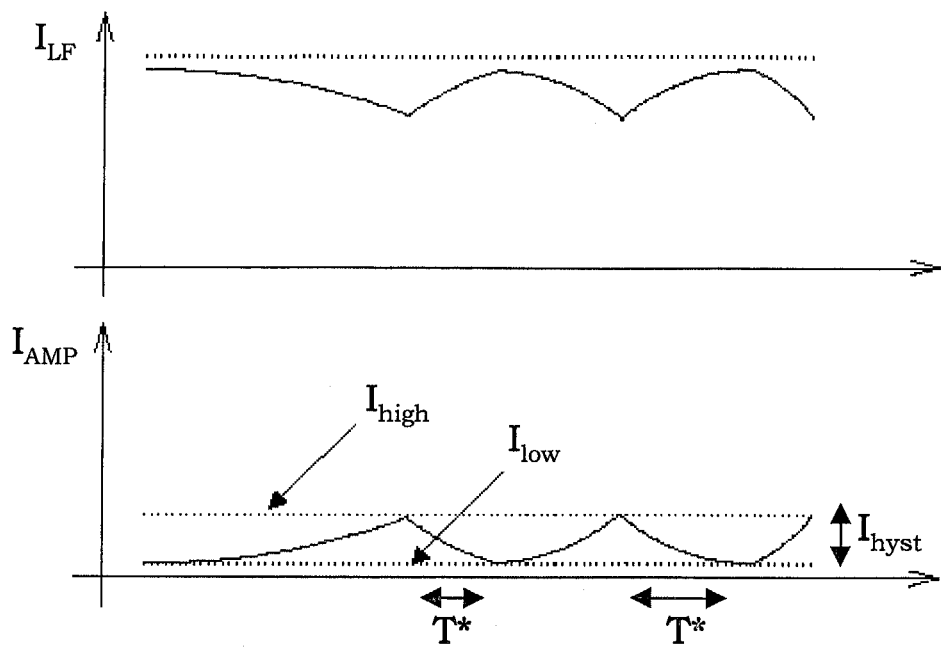
FIG. 7 is a current vs. time diagram for current signals present in the circuit of FIG. 2.

The outcome of this control and the corresponding waveforms are shown in FIG. 7 for a time period indicated with T2 at which the feedback variable acts on the half-bridge LF. During the times indicated with T* the switch M1 is closed since the operational 3 current is higher than the value $I_{LOW}$. The switch M1 is closed until the threshold $I_{LOW}$ is reached. The $I_{HYST}$ value choice is a compromise-choice. A small value results in a high half-bridge switching speed whereas a high value results in a higher dissipation by the linear portion.

Figure 8:
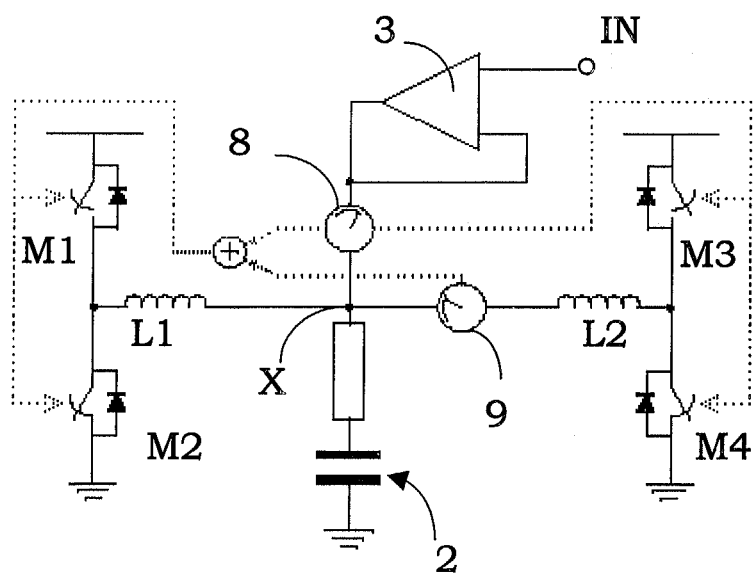
FIG. 8 is a schematic view of a different embodiment of the circuit of FIG. 2.

The previous comments are based on the use of a single feedback variable acting on the two half-bridges LF and HF in time-distinct phases. FIG. 8 shows schematically a different embodiment illustrating the possibility of measuring a second quantity in addition to the linear portion current $I_{AMP}$. In this embodiment, a second current sensor 9 inserted between the inductor L2 and the node X is provided. Therefore, if another quantity is measurable through the second sensor 9, this quantity can be so used as to control both half-bridges. Knowing, for example, the current outputted by the half-bridge HF, $I_{AMP}$ could be used as variable for controlling both the switching of the half-bridge HF during the whole period and the sum $I_{AMP}+I_{HF}$ (equal to $I_{LOAD}-I_{LF}$) to drive the LF stage.

The manner for determining the three times T1, T2, and T3 in an analytical manner will now be described. The following formulas, obtained analytically, allow a real time calculation of said times during the load 2 control phase to be achieved.

Another method for formulating the differential equation which determines the time pattern of the inductor current can be used in other embodiments of the invention A finite difference equation is determined in which the current value, in a precise instant, is given by the sum of the value in the previous instant plus an increase depending on the voltage present at the inductor terminals. Through simple addition using accumulating circuit blocks, it is possible to calculate the inductor current and assess (as clock stroke number) the time required by the current to reach the steady state value Io, thus obtaining T1. Likewise, it is possible to calculate T3 by inverting the time scale. If the inductor starts from a current value equal to zero and reaches the steady state value Io, it is possible to obtain a transient having the same duration as the discharge transient T3 by using a voltage signal which is time-inverted with respect to the signal required. In this case too, simple addition using accumulating circuit blocks are sufficient for the assessment.

Figure 14:
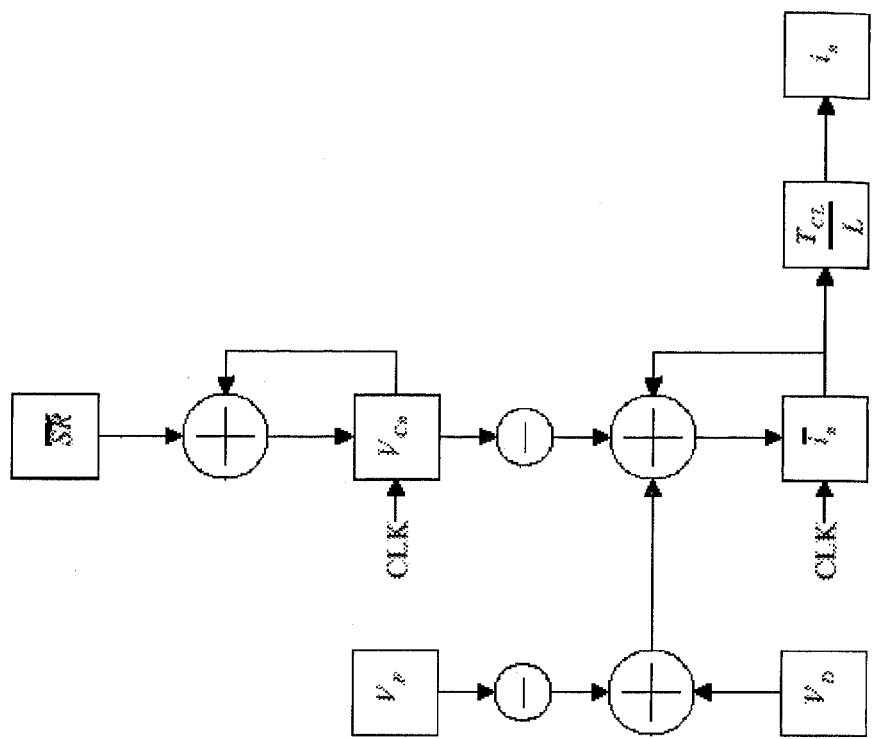
FIGS. 13 and 14 are respective schematic views of circuit portions accompanying the circuit according to an embodiment of the invention.
Figure 13:
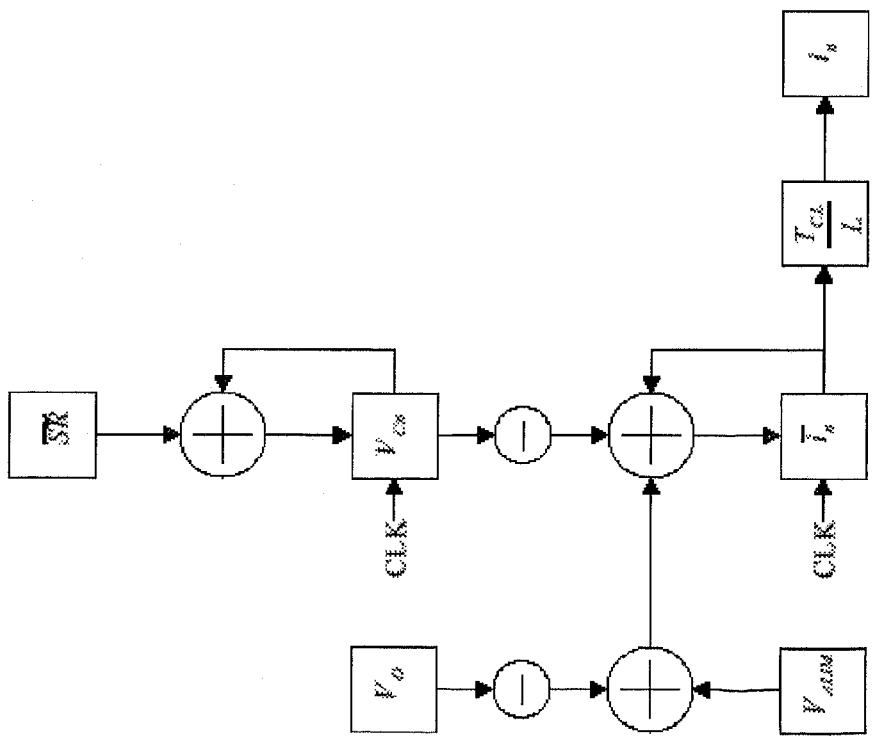

FIGS. 13 and 14 show respective embodiments of circuit networks comprising adding and accumulating blocks which can be used for the above purposes. FIG. 13 shows a circuit for calculating the time T1. The current In value is compared with the current Io value, T1 being reached when these values coincide. FIG. 14 shows a circuit for calculating the time T3. The current In value is compared with the current Io value, T3 being reached when these values coincide.

From the control point of view, four different situations shown in FIGS. 9, 10, 11 and 12 can occur. The cases shown in FIGS. 10 and 11 require a special control. In the case of FIG. 10, the time T3 is known later than the moment of its use for shutting the half-bridge LF off. This occurs because the algorithm does not produce the desired results in the instant of their application. In the case of FIG. 11, the current is so high that the sum of times T1 and T3 is higher than the ramp duration, the assessment being, therefore, useless for control purposes.

In both cases, it is useful to know a time Tx defined as the instant of intersection between the charge and discharge currents of the inductor L1. The time Tx allows the inductor L1 charge to be interrupted so that no residual current is present at the ramp end, the current being otherwise recovered by the linear stage, with subsequent detrimental power dissipation.

Steady state rise time for the inductor L1, i.e. the time required by L1 to reach the current theoretic value (SRC):

rise ramp:

$$t_1 = \frac{V_{ALIM} - V_O}{SR} \sqrt{\left(\frac{V_{ALIM} - V_O}{SR}\right)^2 - 2LC}$$

fall ramp:

$$t_1 = \frac{V_O}{SR} \sqrt{\left(\frac{V_O}{SR}\right)^2 - 2LC}$$

Discharge time required to let the inductor L1 have no residual current at the ramp end:

rise ramp:

$$t_3 = \frac{V_D + V_F}{SR} \sqrt{\left(\frac{V_D + V_F}{SR}\right)^2 - 2LC}$$

fall ramp:

$$t_3 = \frac{V_D + V_{ALIM} - V_F}{SR} \sqrt{\left(\frac{V_D + V_{ALIM} - V_F}{SR}\right)^2 - 2LC}$$

where $V_D$=direct voltage on the feedback diode;

$V_F$=final voltage;

$V_O$=initial voltage;

L=inductor $L_1$;

C=overall load capacity;

$S_R$=voltage ramp slew rate;

$V_{ALIM}$=supply voltage

TIME T1 CALCULATION: At the inductor L1 terminals (L indicating the inductor L1 value) the following differential equation applies:

$$V_L = V_{ALIM} - V_C = L \cdot \frac{di}{dt}$$

by solving it in a discrete form, it becomes $$\frac{\Delta i}{T_{CL}} = \frac{V_{ALIM} - V_C}{L}$$

by solving it in a discrete form also the voltage at the capacitive load terminals:

$$V_C = SR \cdot t + V_O$$

$$V_C = SR \cdot n \cdot T_{CL} + V_O$$

where $$SR = \frac{V_F - V_O}{T_{ON}}$$

$$SR = \frac{V_F - V_O}{n_{ON} \cdot T_{CL}}$$

with $$\overline{SR} = \frac{V_F - V_O}{N_{ON}}$$

and $$SR = \frac{\overline{SR}}{T_{CL}}$$

it becomes $$V_{Cn} = \overline{SR} \cdot n + V_O$$

and then:

$$V_{Cn+1} = V_{Cn} + \overline{SR}$$

with $$V_{CO} = V_O$$

$$i_{n+1} = I_n + \frac{V_{ALIM} - V_O - \overline{SR} \cdot n}{L} T_{CL}$$

through the temporary variable $$\bar{i}_n = i_n \cdot \frac{L}{T_{CL}}$$

$$\overline{i_{n+1}} = \bar{i}_n + V_{ALIM} - V_O - \overline{SR} \cdot n$$

TIME T3 CALCULATION: to calculate the discharge time, when the inductor passes from a current Io to a current equal to zero at the real end of the voltage ramp, assuming to be in said last instant and to go back in time till the instant T3 when the current Io flows through the inductor, it is evident that (by applying the variable replacement t=−τ) that the system is analogue to another one being advanced in time, but with negative voltage ramp, in formulas:

$$L \cdot \frac{di}{di} = -V_D - V_C(t)$$

With $$V_C(t) = V_F + SR \cdot t$$

The previous equation with negative t is equivalent to the following one with positive t:

$$L \cdot \frac{di}{di} = V_D + V_C(t)$$

With $$V_C(t) = V_F - SR \cdot t$$

By solving the latter in a discrete form, it becomes:

$$\frac{\Delta i}{T_{CL}} = \frac{V_D - V_C}{L}$$

by solving the voltage value in a discrete form at the capacitive load terminals:

$$V_C = SR \cdot t + V_O$$

$$V_C = V_F - SR \cdot n \cdot T_{CL}$$

where $$SR = \frac{V_F - V_O}{T_{ON}}$$

$$SR = \frac{V_F - V_O}{n_{ON} \cdot T_{CL}}$$

with $$\overline{SR} = \frac{V_F - V_O}{N_{ON}}$$

and $$SR = \frac{\overline{SR}}{T_{CL}}$$

it becomes $$V_{Cn} = V_F - \overline{SR} \cdot n$$

and then:

$$V_{Cn+1} = V_{Cn} - \overline{SR}$$

with $$V_{CO} = V_F$$

through the temporary variable $$\bar{i}_n = i_n \cdot \frac{L}{T_{CL}}$$

$$\overline{i_{n+1}} = \bar{i}_n + V_D + V_F - \overline{SR} \cdot n$$

Tx TIME CALCULATION: simple calculations generate the following formula:

$$T_X = T_{ON} \cdot \frac{V_D + \frac{V_F + V_O}{2}}{V_D + V_{DD}}$$

From the foregoing description, it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An electronic circuit for driving a piezoelectric load comprising:
   (a) a linear drive block operable to provide a first portion of a drive current to the piezoelectric load;
   (b) a first switching block operable to provide a second portion of the drive current to the piezoelectric load through a first inductor;
   (c) a second switching block operable to provide a third portion of the drive current to the piezoelectric load through a second inductor; and
   (d) a control block operable to control the switching of the first and second switching blocks.

2. The electronic circuit of claim 1, wherein the first and second inductor have different inductances.

3. The electronic circuit of claim 1, wherein the first and the second switching blocks comprise a pair of transistors coupled between a supply voltage and a ground reference.

4. An electronic circuit for driving a piezoelectric load comprising:
   (a) a linear drive block operable to provide a first portion of a drive current to the piezoelectric load;
   (b) a first switching block operable to provide a second portion of the drive current to the piezoelectric load through a first inductor;
   (c) a second switching block operable to provide a third portion of the drive current to the piezoelectric load through a second inductor;
   (d) a control block operable to control the switching of the first and second switching blocks; and
   (e) a current sensor connected between the linear drive block and the piezoelectric load.

5. The electronic circuit of claim 4, wherein the current sensor provides a control parameter to the control block.

6. The electronic circuit of claim 1 wherein the control block is operable to switch the first and second switching circuits in a predetermined timing sequence.

7. The electronic circuit of claim 6, wherein the timing sequence comprises:
   (a) a steady-state response phase; and
   (b) a transient-state response phase.

8. An electronic circuit for driving a piezoelectric load comprising:
   (a) a linear drive block operable to provide a first portion of a drive current to the piezoelectric load;
   (b) a first switching block operable to provide a second portion of the drive current to the piezoelectric load through a first inductor;
   (c) a second switching block operable to provide a third portion of the drive current to the piezoelectric load through a second inductor; and
   (d) a control block operable to control the switching of the first and second switching blocks, wherein
   the first portion of the drive current comprises a corrective current;
   during a transient phase, the second portion of the drive current comprises a plurality of current peaks; and
   the third portion of the drive current comprises a majority of the drive current.

9. A method for driving a piezoelectric load, the method comprising:
   (a) supplying a first portion of a drive current to the piezoelectric load via a first inductor; and
   (b) supplying a second portion of the drive current to the piezoelectric load via a second inductor; and
   (c) supplying a third portion of the drive current to the piezoelectric load via a linear drive circuit.

10. The method of claim 9 wherein:
    the first inductor has a first inductance; and
    the second inductor has a second inductance that is different than the first inductance.

11. The method of claim 9, further comprising supplying the first and second portions of the drive current to the piezoelectric load through a cable.

12. Circuit for highly efficient driving of piezoelectric loads, comprising a linear driving circuit portion connected to the load through an inductive-resistive connection whereto a voltage waveform is applied, wherein it comprises at least a further circuit portion connected to the load by said connection and by an inductance to supply a considerable fraction of the overall current required by the load in the transient and steady state respectively.

13. Circuit according to claim 12, wherein it comprises respective circuit portions connected in a structurally independent manner to said connection by means of respective inductances.

14. Circuit according to claim 12, wherein it comprises a single control block for driving said circuit portions.

15. Circuit according to claim 12, wherein said at least further circuit portion comprises a half-bridge circuit comprising at least a switching device powered between a first supply voltage reference and a second ground reference.

16. Circuit according to claim 13, wherein each further circuit portion comprises a half-bridge circuit including at least a switching device powered between a first supply voltage reference and a second ground reference.

17. Circuit according to claim 13, wherein said inductances have different values.

18. Circuit according to claim 16, wherein each half-bridge circuit comprises a pair of transistors and is coupled with the load by means of one of said inductors.

19. Circuit according to claim 18, wherein the control terminals of the half-bridge circuit transistors are all connected to control block outputs.

20. Circuit for highly efficient driving of piezoelectric loads, comprising a linear driving circuit portion connected to the load through an inductive-resistive connection whereto a voltage waveform is applied, wherein it comprises at least a further circuit portion connected in turn to said connection by means of an inductance to supply a considerable fraction of the overall current required by the load in the transient and steady state respectively, and wherein the circuit comprises a single control block for driving said circuit portions, and wherein the circuit comprises a current sensor connected downstream of said linear portion and to said control block.

21. Method for driving a piezoelectric load with an inductive-resistive connection wherein at least a linear driving of said load is provided through a driver circuit equipped with a linear circuit portion connected to the load through said connection, wherein two further distinct driving modes are provided, a transient and a steady state mode, wherein further respective circuit portions, structurally independent and connected in turn to said connection through respective inductances, provide a considerable fraction of the overall current required by the load.

22. Method according to claim 21, wherein each further circuit portion is independently activated according to the value of a current outputted by said linear portion.

23. Method according to claim 21, wherein each further portion comprises a half-bridge transistor circuit powered between a first supply voltage reference and a second ground reference coupled with the load through one of said inductances.

24. Method according to claim 23, wherein said inductances have different values.

25. Method according to claim 22, wherein said circuit portions are activated according to a time schedule depending on the value of said current and corresponding to a transient state, a steady state and a discharge state respectively.

26. Method for driving a piezoelectric load with inductive-resistive connection wherein at least a linear driving of said load is provided through a driver circuit equipped with a linear circuit portion connected to the load through said connection, wherein two further distinct driving modes are provided, a transient and a steady state mode, wherein further respective circuit portions, structurally independent and connected in turn to said connection through respective inductances, provide a considerable fraction of the overall current required by the load, and wherein each further circuit portion is independently activated according to the value of a current outputted by said linear portion, and wherein said current required by the load is split into three distinct parts:

two current peaks supplied by one circuit portion at the transient phase starting;

most of the current of the steady state supplied by the other circuit portion; and a corrective current supplied by the linear portion.

27. A system comprising:
(a) a piezoelectric load;
(b) a cable coupled to the piezoelectric load; and
(c) an electronic circuit coupled to the cable comprising:
  (i) a linear drive block operable to provide a first portion of a drive current to the piezoelectric load;
  (ii) a first switching block operable to provide a second portion of the drive current to the piezoelectric load through a first inductor;
  (iii) a second switching block operable to provide a third portion of the drive current to the piezoelectric load through a second inductor; and
  (iv) a control block operable to control the switching of the first and second switching blocks.

28. The system of claim 27 wherein the piezoelectric load comprises a printer head.

29. A method for driving a piezoelectric load, the method comprising:
  supplying a first portion of a drive current to the piezoelectric load via a first inductor;
  supplying a second portion of the drive current to the piezoelectric load via a second inductor;
  supplying a third portion of the drive current to the piezoelectric load; and
  changing the first and second portions of the drive current based on the third portion of the drive current.

* * * * *